(12) United States Patent
Snai et al.

(10) Patent No.: US 11,595,007 B2
(45) Date of Patent: Feb. 28, 2023

(54) ACTIVE FEEDBACK WIDEBAND LOW-NOISE AMPLIFIER

(71) Applicant: QUALCOMM Incorporated, San Diego, CA (US)

(72) Inventors: Makar Snai, Bangalore (IN); Manohar Seetharam, Bangalore (IN)

(73) Assignee: QUALCOMM Incorporated, San Diego, CA (US)

(*) Notice: Subject to any disclaimer, the term of this patent is extended or adjusted under 35 U.S.C. 154(b) by 120 days.

(21) Appl. No.: 17/081,873

(22) Filed: Oct. 27, 2020

(65) Prior Publication Data

US 2022/0131505 A1 Apr. 28, 2022

(51) Int. Cl.
H03F 1/22 (2006.01)
H03F 1/26 (2006.01)

(52) U.S. Cl.
CPC ............. *H03F 1/26* (2013.01); *H03F 1/223* (2013.01); *H03F 2200/141* (2013.01); *H03F 2200/294* (2013.01)

(58) Field of Classification Search
CPC .................. H03F 1/22; H03F 3/2176
USPC ................................ 330/310, 311
See application file for complete search history.

(56) References Cited

U.S. PATENT DOCUMENTS

| | | | |
|---|---|---|---|
| 9,444,413 B2* | 9/2016 | Mastantuono | H03F 3/193 |
| 10,381,991 B1* | 8/2019 | Sanner | H03F 3/193 |
| 10,965,256 B2* | 3/2021 | Seshita | H03F 3/195 |

\* cited by examiner

*Primary Examiner* — Henry Choe
(74) *Attorney, Agent, or Firm* — Haynes and Boone LLP

(57) ABSTRACT

An active feedback low-noise amplifier includes a feedback transistor whose source couples through a feedback path to an input signal node. A bias transistor biases the source of the feedback transistor with a bias current responsive to an input signal carried on the input signal node.

25 Claims, 6 Drawing Sheets

US 11,595,007 B2

ACTIVE FEEDBACK WIDEBAND LOW-NOISE AMPLIFIER

TECHNICAL FIELD

This application relates to amplifiers, and more particularly to an active feedback wideband low-noise amplifier.

BACKGROUND

According to Friis' formula, the noise factor for the first amplifier in a succession of amplifiers will dominate the overall noise factor for the amplification chain. In a wireless receiver, this first amplifier is thus a low-noise amplifier (LNA) since its noise factor is so critical for the receiver to have a suitably low noise factor (NF). To provide a low NF, an LNA may use a source inductor to provide source degeneration. To avoid the cost and routing issues of such a source inductor, LNAs may use a passive feedback resistor that also functions to provide negative feedback (degeneration). But the passive feedback through the feedback resistor increases the NF so an attractive alternative is to drive the feedback resistor through the source of a feedback transistor.

SUMMARY

In accordance with a first aspect of the disclosure, a low-noise amplifier is provided that includes an input signal node; a drive stage configured to amplify an input voltage signal on the input signal node into an output voltage signal on an output node; a feedback transistor having a gate coupled to the output node; and a bias transistor having a drain coupled to a source of the feedback transistor and having a gate coupled to the input signal node.

In accordance with a second aspect of the disclosure, a method for a low-noise amplifier is provided that includes: amplifying an input voltage signal carried on an input signal node to form an output voltage signal; driving a gate of a feedback transistor with the output voltage signal; conducting a bias current through a bias transistor responsive to the input voltage signal; biasing a source of the feedback transistor with the bias current; and coupling a voltage of the source of the feedback transistor through a feedback path to the input signal node.

In accordance with a third aspect of the disclosure, a low-noise amplifier is provided that includes: a high-gain drive stage; a low-gain drive stage; a feedback transistor; a first bias transistor having a gate connected to an input signal node for the high-gain drive stage; a first switch transistor configured to switch on during a high-gain mode of operation for the low-noise amplifier to couple a source of the feedback transistor to ground through the first bias transistor and to switch off during a low-gain mode of operation for the low-noise amplifier; a second bias transistor having a gate connected to an input signal node for the low-gain drive stage; and a second switch transistor configured to switch on during the low-gain mode of operation for the low-noise amplifier to couple the source of the feedback transistor to ground through the second bias transistor and to switch off during the high-gain mode of operation for the low-noise amplifier.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
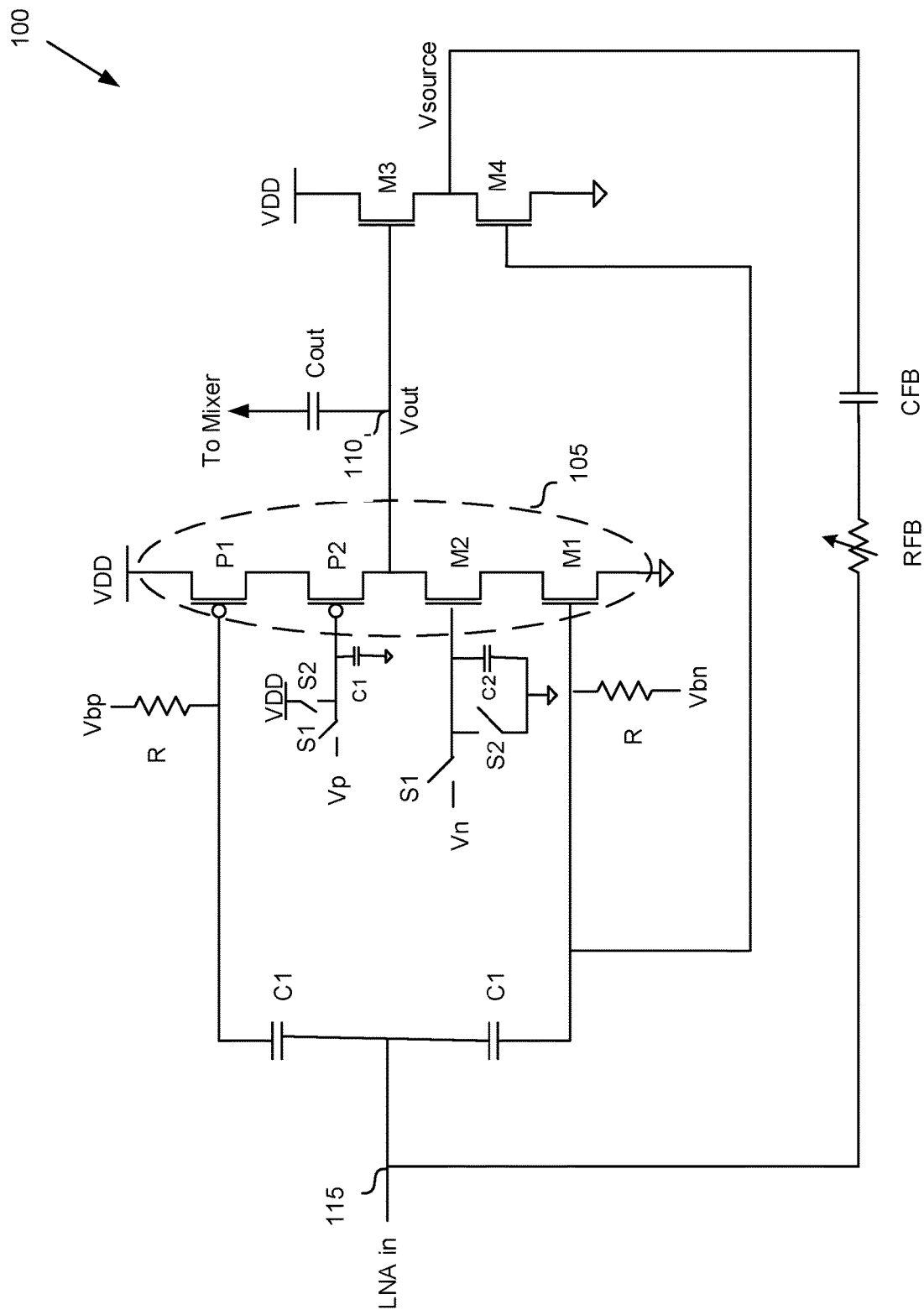
FIG. 1 illustrates a low-noise amplifier having an NMOS feedback transistor biased by an input-signal-driven bias transistor in accordance with an aspect of the disclosure.

As compared to the use of passive feedback, active feedback provides an increased transconductance and an improved (lowered) NF. But the feedback transistor is exposed to the swing of the LNA's output signal that in turn causes a swing in the gate-to-source voltage (Vgs) of the feedback transistor. This Vgs swing for the feedback transistor may produce an undesirable level of third-order intermodulation products (IM3) in the output signal.

A current source transistor may be used in certain implementations to bias the feedback transistor in an active feedback LNA. Although the resulting active feedback provides a superior noise factor as compared to the use of passive feedback, the gate-to-source voltage variation for the current-source-biased feedback transistor results in an undesirable level of third-order intermodulation products (IM3). In general, higher order harmonics may be readily filtered from the output signal. But intermodulation products tend to be fairly close to the passband of the LNA such that it becomes problematic to filter out the intermodulation products. This may readily be appreciated through a consideration of a scenario in which two tones f1 and f2 that are relatively close in frequency to each other are input to an LNA. The desired linear output signal is then the gain (G) of the LNA times the input tones f1 and f2. An nth order harmonic of the input tones will have frequencies such as at n*f1 and n*f2. These higher-order harmonics are thus relatively displaced in frequency from the desired output tones at frequencies f1 and f2. But the third order intermodulation products at the frequencies of 2f1−f2 and 2f2−f1 are substantially at the same frequency as the tones f1 and f2. To filter out such intermodulation products may require expensive (e.g., in terms of area or cost) or potentially-unrealizable filters. The third-order intermodulation products produced by an LNA are thus also an important design factor in addition to the LNA's noise factor.

The production of third-order intermodulation products in an active-feedback LNA may be better appreciated through the following discussion. The output voltage signal of an active feedback LNA drives a gate of the feedback transistor. The gate voltage of the feedback transistor thus has a relatively large swing due to the variations in the output voltage signal. This swing in the gate voltage for the feedback transistor produces the third-order intermodulation products and the resulting non-linearity in the output voltage signal. To lower the intermodulation products, an active-feedback LNA is disclosed in which the bias transistor biasing a source of the feedback transistor is also driven by the input signal. The active feedback current from the source of the feedback transistor through the active feedback path is thus not only dependent on the current conducted by the feedback transistor but also on the signal-dependent bias current conducted by the bias transistor. Note that the output signal and the input signal to an active feedback LNA are substantially complementary to each other. If the input voltage signal rises, the output voltage signal will thus tend to drop. Conversely, if the input voltage signal falls, the output voltage signal will tend to rise. Should the feedback transistor be an n-type metal-oxide semiconductor (NMOS) feedback transistor, it will thus tend to switch on as the output voltage signal rises and will tend to switch off as the output voltage signal falls. The source voltage of the feedback transistor will thus tend to rise as the input voltage signal rises and tend to fall as the input voltage signal falls. Should the bias transistor be an NMOS bias transistor, the NMOS bias transistor couples between the source of the feedback transistor and ground. A rising input voltage signal will tend to switch on the bias transistor and lower the source voltage of the feedback transistor. Conversely, a falling input voltage signal will tend to switch off the bias transistor to boost the source voltage of the feedback transistor. The bias transistor will thus advantageously oppose the source voltage swing that would otherwise occur if the bias transistor were biased by a static bias voltage. The gate-to-source voltage swing for the feedback transistor is thus reduced by the split of the feedback current conduction by the feedback transistor and the input-signal-driven bias transistor, which advantageously reduces the intermodulation products yet retains the transconductance boost and noise figure lowering of active feedback.

An example active-feedback LNA 100 is shown in FIG. 1. An LNA gain stage 105 includes a p-type metal-oxide semiconductor (PMOS) drive transistor P1 having a source connected to a power supply node for a power supply voltage VDD and a drain coupled through a PMOS cascode transistor P2 to an output node 110 for an output voltage signal Vout. As used herein, a component is deemed to be "coupled" to another component through an electrical connection that may be direct such as through an electrical lead or connector or may be indirect such as through an intervening component such as an intervening transistor, capacitor, or resistor. LNA gain stage 105 also includes an NMOS drive transistor M1 having a source connected to ground and a drain coupled through an NMOS cascode transistor M2 to the output node 110. As used herein, a component is deemed to be "connected" to another component through a direct electrical connection as opposed to being coupled through an intervening component. An input signal such as a received RF signal from an antenna (not illustrated) carried on an input signal node 115 capacitively couples through respective input capacitors C1 to a gate of transistor P1 and a gate of transistor M1. LNA gain stage 105 is thus in a common drain configuration with respect to the relationship between drive transistors P1 and M1 and output node 110. Should the input voltage signal drop toward ground, drive transistor P1 will tend to switch on and charge the output voltage signal towards the supply voltage VDD. Conversely, as the input voltage signal rises above ground, drive transistor M1 will tend to switch on and discharge the output voltage signal. Drive transistors P1 and M1 are thus in a "push-pull" configuration in that drive transistor P1 will tend to charge (push) the output voltage signal whereas drive transistor M1 will tend to discharge (pull) the output voltage signal. A bias voltage Vbp biases the gate of drive transistor P1 through a resistor R. Similarly, a bias voltage Vpn biases the gate of drive transistor M1 through another resistor R.

Each cascode transistor is biased through the closing of a respective switch 51 during operation of LNA 100. A gate of cascode transistor P2 is then charged to a bias voltage Vp whereas a gate of cascode transistor M2 is charged to a bias voltage Vn. A respective capacitor C2 for each cascode transistor supports the cascode transistor's bias voltage. When LNA 100 is inactive, the gate of the cascode transistor P2 is charged to VDD to switch cascode transistor P2 off through the closing of a respective switch S2. Similarly, the gate of cascode transistor M2 is grounded through the closing of a respective switch S2 to switch cascode transistor M2 off.

The output voltage signal capacitively couples to another receiver stage such as a mixer (discussed further below) through an output capacitor Cout. The output voltage signal also drives the gate of an NMOS feedback transistor M3. A drain of the feedback transistor M3 connects to the power supply node whereas a source of the feedback transistor M3 couples through a feedback path formed by a feedback capacitor CFB in series with a feedback resistor RFB that couples to the input signal node 115. A difference between a source voltage Vsource on the source of the feedback transistor M3 and the input voltage signal determines a feedback current that flows through the feedback path to function as negative feedback from the output voltage signal to the input voltage signal.

Feedback resistor RFB may be a tunable resistor that is tuned to adjust an input impedance for LNA 100. For example, LNA 100 may be used in a wideband 5G cellular telephone transceiver that functions in multiple bands such as from the n77 band (3.3 GHz) to the n79 band (4.9 GHz). A resistance of feedback resistor RFB may be adjusted accordingly to provide a relatively constant input impedance for LNA 100 across this wideband coverage. The source of the feedback transistor M3 also connects to a drain of a bias transistor M4 having a source connected to ground. A gate of bias transistor M4 also couples to the input node 115 and is connected to the gate of transistor M1. Bias transistor M4 thus not only functions as a current source but also opposes the drive of the Vsource voltage that would otherwise occur from the output voltage signal. As discussed previously, a lowering of the input voltage signal results in a rise in the output voltage signal. Feedback transistor M3 will then tend to switch on to lower the Vsource voltage. But this same lowering of the input voltage signal reduces the bias current conducted by bias transistor M4 and thus tends to increase the source voltage. Conversely, a rise in the input voltage signal will tend to switch off the feedback transistor M3 to increase the Vsource voltage. But this same rise in the input voltage signal will tend to switch on bias transistor M4 so as to attempt to lower the Vsource voltage. The biasing of bias transistor M4 thus tends to oppose the action on the Vsource voltage that results from gain stage 105 and the feedback transistor M4. The swing in the output voltage signal that would otherwise cause a corresponding swing in the gateto-source voltage of the feedback transistor M3 is thus opposed by the input-voltage-signal-driven action of bias transistor M4.

This reduction in the gate-to-source voltage swing for the feedback transistor M3 allows the feedback transistor M3 to function more linearly and thus lowers the third-order intermodulation (IM3) products in the output voltage signal. The benefits of the input-voltage-signal driven action of bias transistor M4 may be better appreciated through a theoretical comparison of the gate-to-source voltage of the feedback transistor M3 that would result if bias transistor M4 had a static bias voltage driving its gate versus the gate-to-source voltage for the feedback transistor M3 that results from the input-voltage-signal drive of bias transistor M4. With regard to this theoretical discussion, the gain of gain stage 105 is assumed to equal a factor −A. The minus sign results from the complementary push-pull action of gain stage 105. The output voltage is thus equal to −A*Vin, where Vin is the input voltage signal. If the bias transistor M4 had a static bias at its gate, it can be shown the gate-to-source voltage for the feedback transistor M3 is given by a ratio (−A*Vin)/(1+ gm3*RFB), where RFB is the resistance of the feedback resistor RFB and gm3 is the transconductance of the feedback transistor M3. In contrast, it can be shown that the gate-to-source voltage for the feedback transistor M3 in active-feedback LNA 100 is given by a ratio (−A*Vin+ gm4*RFB)/(1+gm3*RFB), where gm4 is the transconductance of bias transistor M4. The gate-to-source voltage for the feedback transistor M3 in LNA 100 is thus reduced as compared to the use of a static bias for bias transistor M4. In some embodiments, the gate-to-source voltage swing for the feedback transistor M3 may be lower than one-half of the gate-to-source voltage swing with a static bias. Such a reduction in the gate-to-source voltage swing may result in a more than 6 dB improvement (increase) in the third order intercept IIP3 due to the resulting reduction of the IM3 intermodulation products. Advantageously, the input voltage signal drive to the gate of bias transistor M4 allows the use of a higher value of the feedback resistance RFB to provide the same input impedance to LNA 100 as would occur with the use of a static bias for bias transistor M4. As shown by the theoretical discussion above, this increase in the feedback resistance RFB reduces the inherent IIP3 that would otherwise result from the feedback transistor M3.

Figure 2:
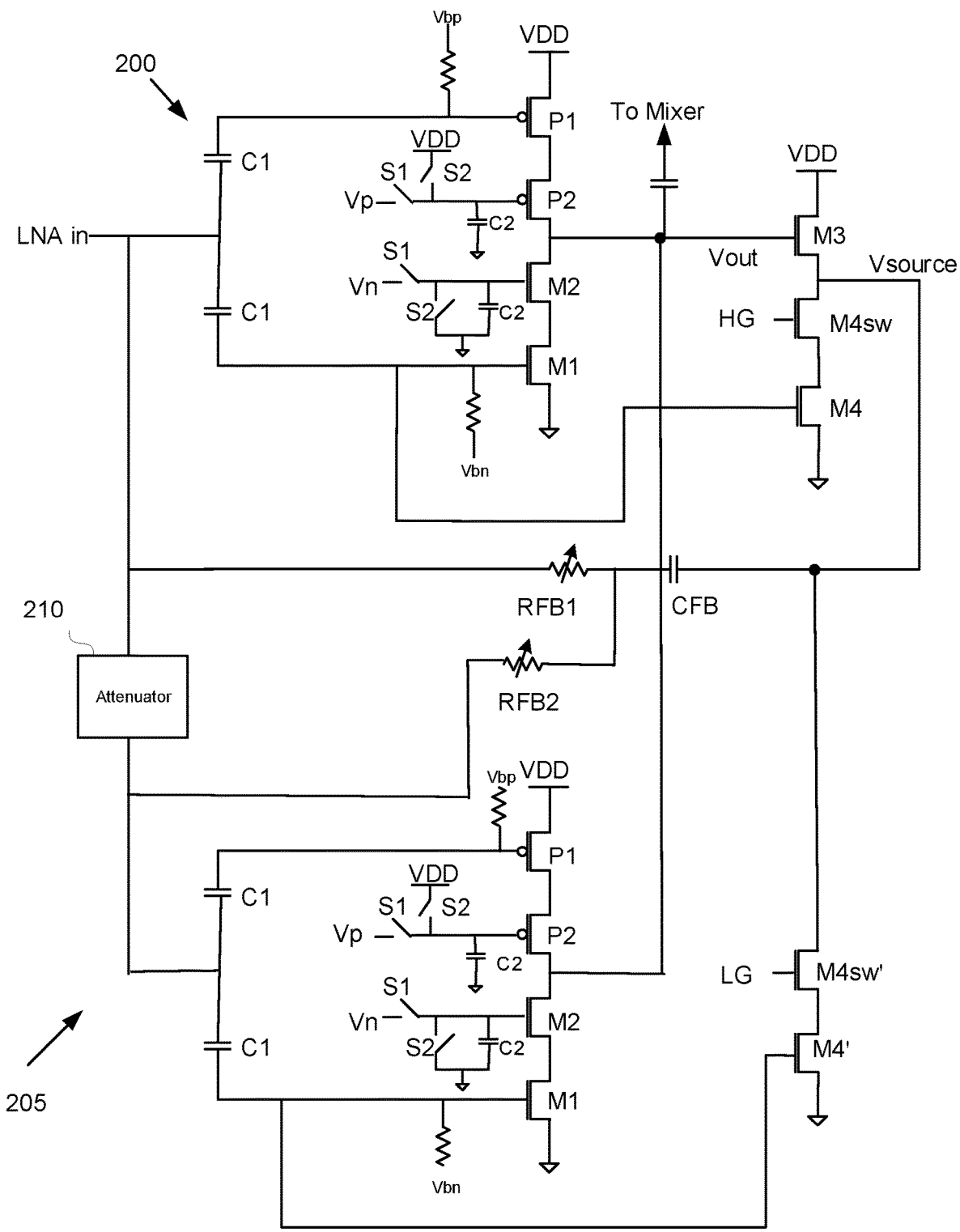
FIG. 2 illustrates a low-noise amplifier having a feedback transistor biased by an input-signal-driven bias transistor during a high-gain mode of operation and biased by an attenuated-input-signal-driven bias transistor during a low-gain mode of operation in accordance with an aspect of the disclosure.

Depending upon its mode of operation, a receiver may require a relatively high gain from an LNA or a reduced gain. The LNA architecture discussed with regard to LNA 100 may be utilized in an active-feedback LNA having a high-gain drive stage 200 and a low-gain drive stage 205 as shown in FIG. 2. High-gain drive stage 200 and low-gain drive stage 205 each includes the set of transistors P1, P2, M2, and M1 arranged analogously as discussed with regard to drive stage 105 of LNA 100. Cascode transistors P2 and M2 are similarly biased. The input voltage signal drives the gates of drive transistors M1 and P1 in high-gain drive stage 200 through respective input capacitors C1 as also discussed with regard to LNA 100. Low-gain drive stage 205 is analogous except that the input voltage signal is attenuated by an attenuator 210 before driving the gates of its drive transistors M1 and P1 through respective input capacitors C1.

The drains of the cascode transistors P2 and M2 in high-gain drive stage 200 drive the output voltage signal when a high-gain mode of operation is active. The output voltage signal drives the gate of the feedback transistor M3 that is also shared with the low-gain drive stage 205 depending upon whether the high-gain or a low-gain mode of operation is active. In the high-gain mode of operation, a high-gain signal HG is asserted to switch on an NMOS switch transistor M4sw that has a drain connected to the source of the feedback transistor M3 and has a source connected to the drain of bias transistor M4. The gate of bias transistor M4 connects to the gate of drive transistor M1 in high-gain drive stage 200 analogously as discussed for LNA 100. When the high-gain signal is asserted to the power supply voltage VDD, switch transistor M4sw switches on so that high-gain drive stage 200 functions to drive the output voltage signal. During the high-gain mode of operation, a feedback path formed by a feedback capacitor CFB and a tunable first feedback resistor RFB1 couples from the source of the feedback transistor M3 to the input signal node. In a low-gain mode of operation, the high-gain signal is discharged to ground to switch off switch transistor M4sw and prevent the high-gain drive stage 200 from driving the output voltage signal.

During the low-gain mode of operation, a low-gain signal LG is asserted that switches on an NMOS switch transistor M4sw'. Transistor M4sw' has a drain connected to the source of the feedback transistor M3 and has a source connected to a source of a bias transistor M4'. The drains of the cascode transistors M2 and P2 in low-gain drive stage 205 connect to a node for the output voltage signal. The gate of drive transistor M1 in the low-gain drive stage 205 couples to the gate of transistor M4'. Low-gain drive stage 205 has its own tunable second feedback resistor RFB2 that couples between a second terminal of feedback capacitor CFB and an output of the attenuator 210 (the input node to the low-gain LNA 205). A first terminal of the feedback capacitor CFB connects to the source of the feedback transistor M3. Low-gain stage 205 thus functions to drive the output voltage signal when the low-gain signal LG is asserted to the power supply voltage in an analogous fashion as discussed for LNA 100.

Figure 3:
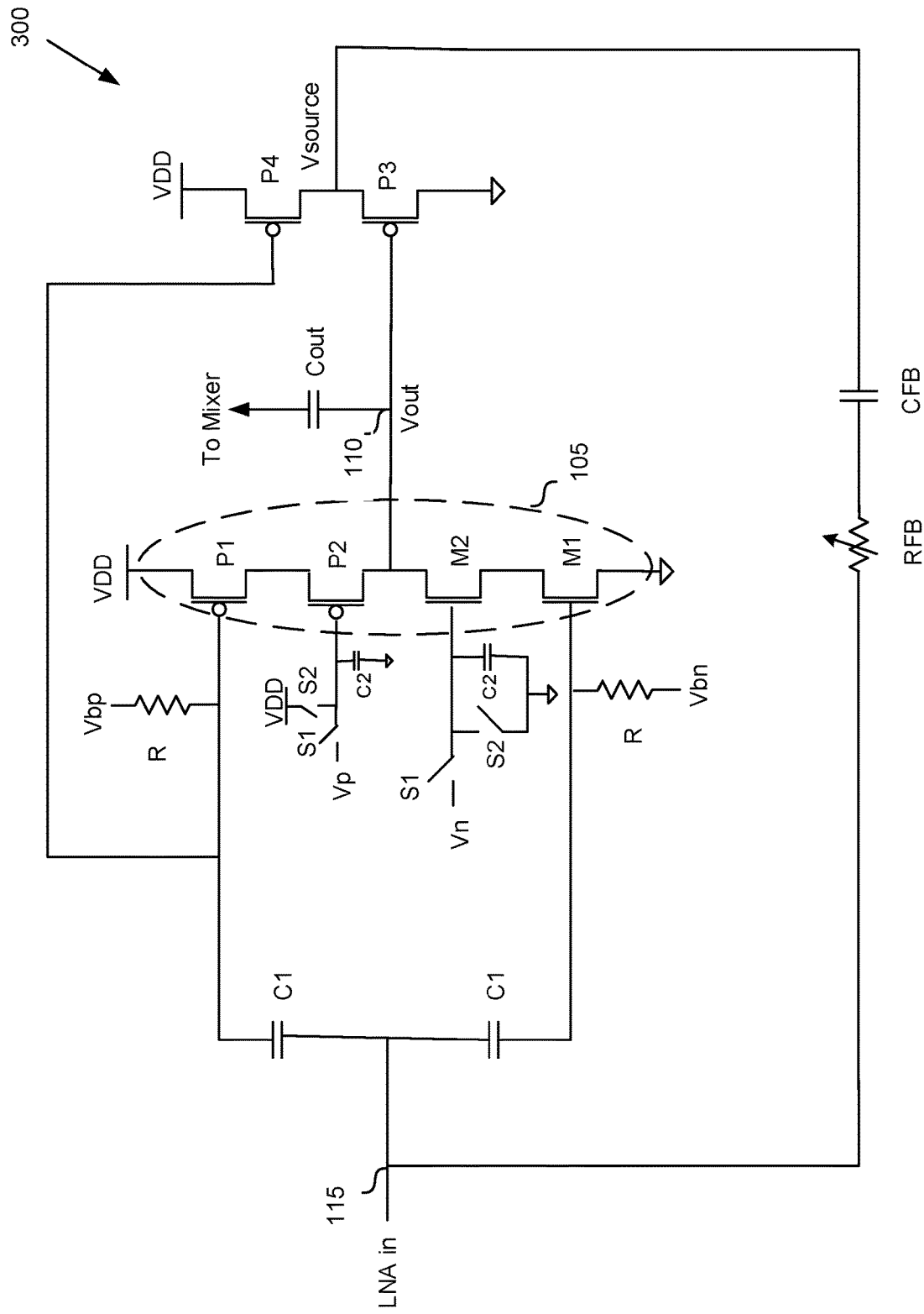
FIG. 3 illustrates a low-noise amplifier having a PMOS feedback transistor biased by an input-signal-driven bias transistor in accordance with an aspect of the disclosure.

LNA 100 may be modified so that the feedback transistor and its bias transistor are PMOS transistors as shown for an LNA 300 of FIG. 3. LNA 300 includes a drive stage 105 that is biased and arranged as discussed for LNA 100. But the output node 110 in LNA 300 drives a gate of a PMOS feedback transistor P3 having a drain connected to ground and a source connected to a drain of a PMOS bias transistor P4 having a source connected to the power supply node for the power supply voltage VDD. To provide the input signal drive to bias transistor P4, the gate of bias transistor P4 is connected to a gate of drive transistor P1. The source voltage Vsource for the feedback transistor P3 drives a feedback path having a feedback capacitor CFB and a tunable feedback resistor RFB analogously as discussed for LNA 100. LNA 300 will thus also have an advantageous reduction in IM3 intermodulation products as discussed analogously for LNA 100.

Figure 4A:
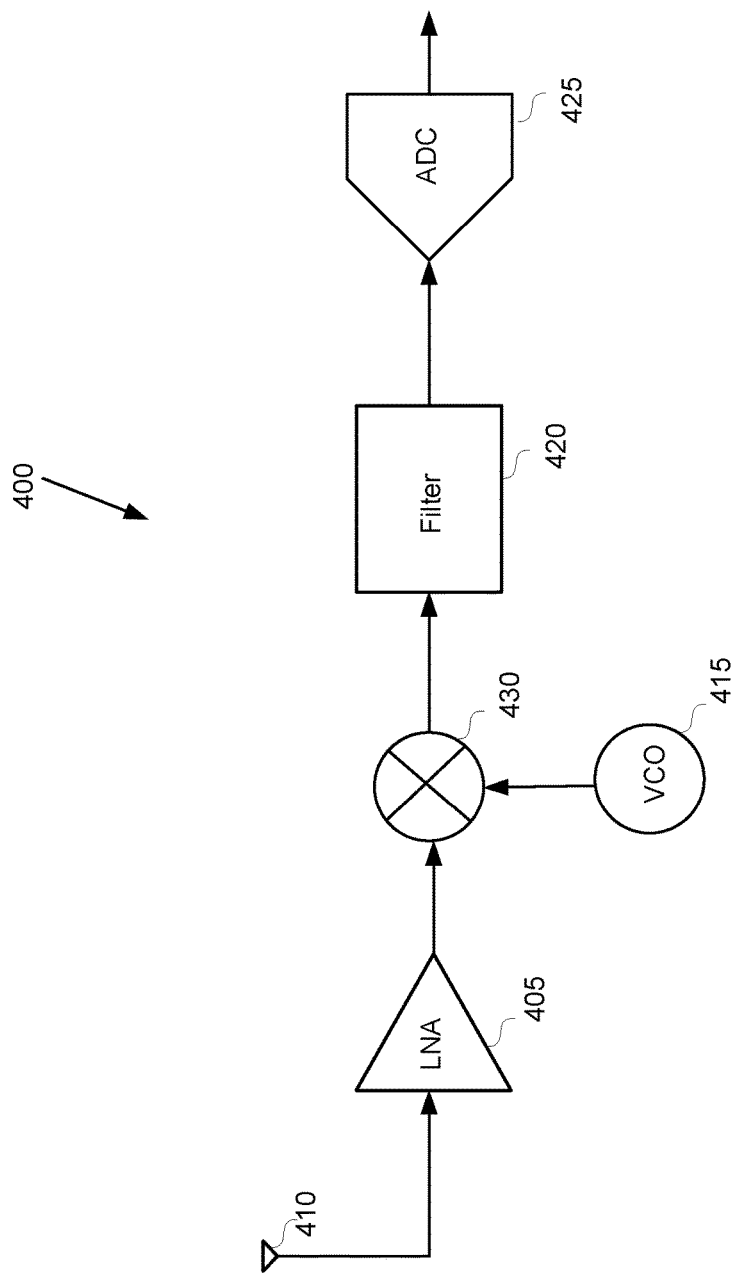
FIG. 4A illustrates a receiver incorporating a low-noise amplifier having a feedback transistor biased by an input-signal-driven bias transistor in accordance with an aspect of the disclosure.

The LNAs disclosed herein may be utilized in any suitable receiver architecture. An example cellular telephone receiver 400 (which may also be applicable to other suitable receive architectures such as WLAN or other WWAN systems) is shown in FIG. 4A. An LNA 405 includes a feedback transistor and an input-signal-driven bias transistor arranged as disclosed herein to reduce the IM3 intermodulation products that would otherwise result from the use of active feedback. LNA 405 amplifies an input voltage signal such as produced by a received RF signal from an antenna 410 (or antennas). The output voltage signal from LNA 405 is mixed in a mixer 430 with a local oscillator signal such as from a voltage-controlled oscillator (VCO) 415 to produce an analog baseband signal that is filtered by a filter 420 before being digitized by an analog-to-digital converter (ADC) 425 to form a digital baseband signal. Filter 420 may instead be implemented in the digital domain downstream from ADC 425 as known in the receiver arts.

Figure 4B:
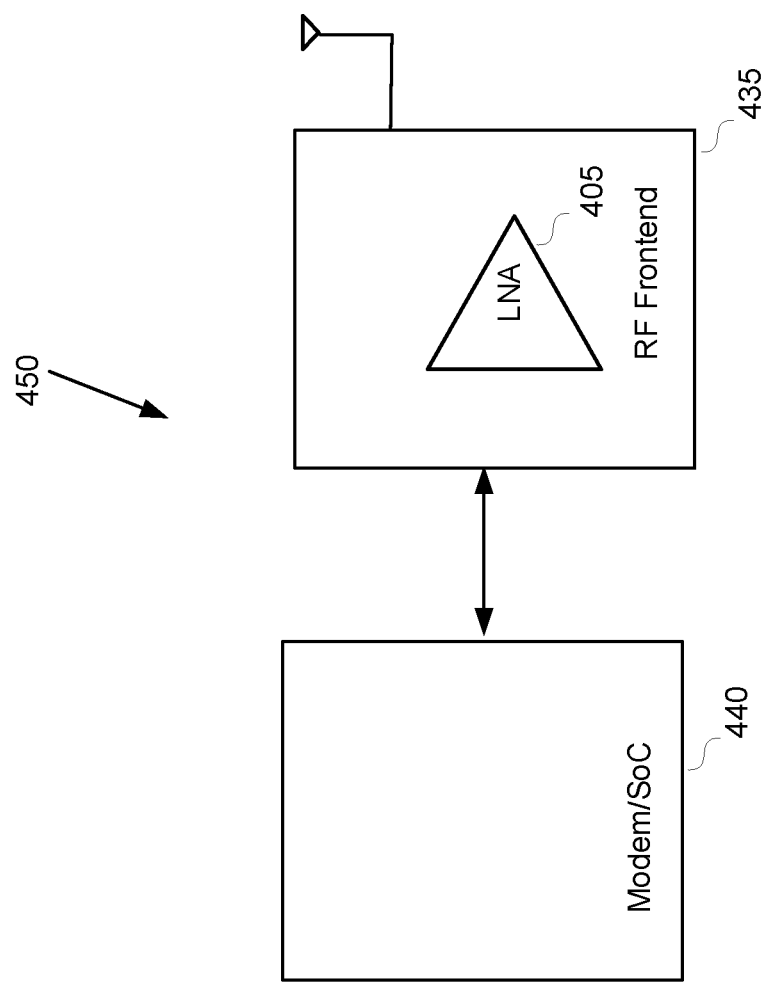
FIG. 4B illustrates a cellular telephone incorporating a low-noise amplifier having a feedback transistor biased by an input-signal-driven bias transistor in accordance with an aspect of the disclosure.

A receiver with an LNA as disclosed herein may be integrated into a transceiver RF frontend circuit 435 within a cellular telephone 450 as shown in FIG. 4B. Transceiver RF frontend circuit converts a digital baseband signal from a modem 440 into an RF signal for transmission to a remote network node such as a base station (not illustrated). Transceiver RF frontend also functions to convert a received RF signal into a digital baseband signal for modem 440. In some implementations, modem 400 may also be integrated within a system-on-a-chip (SoC).

Figure 5:
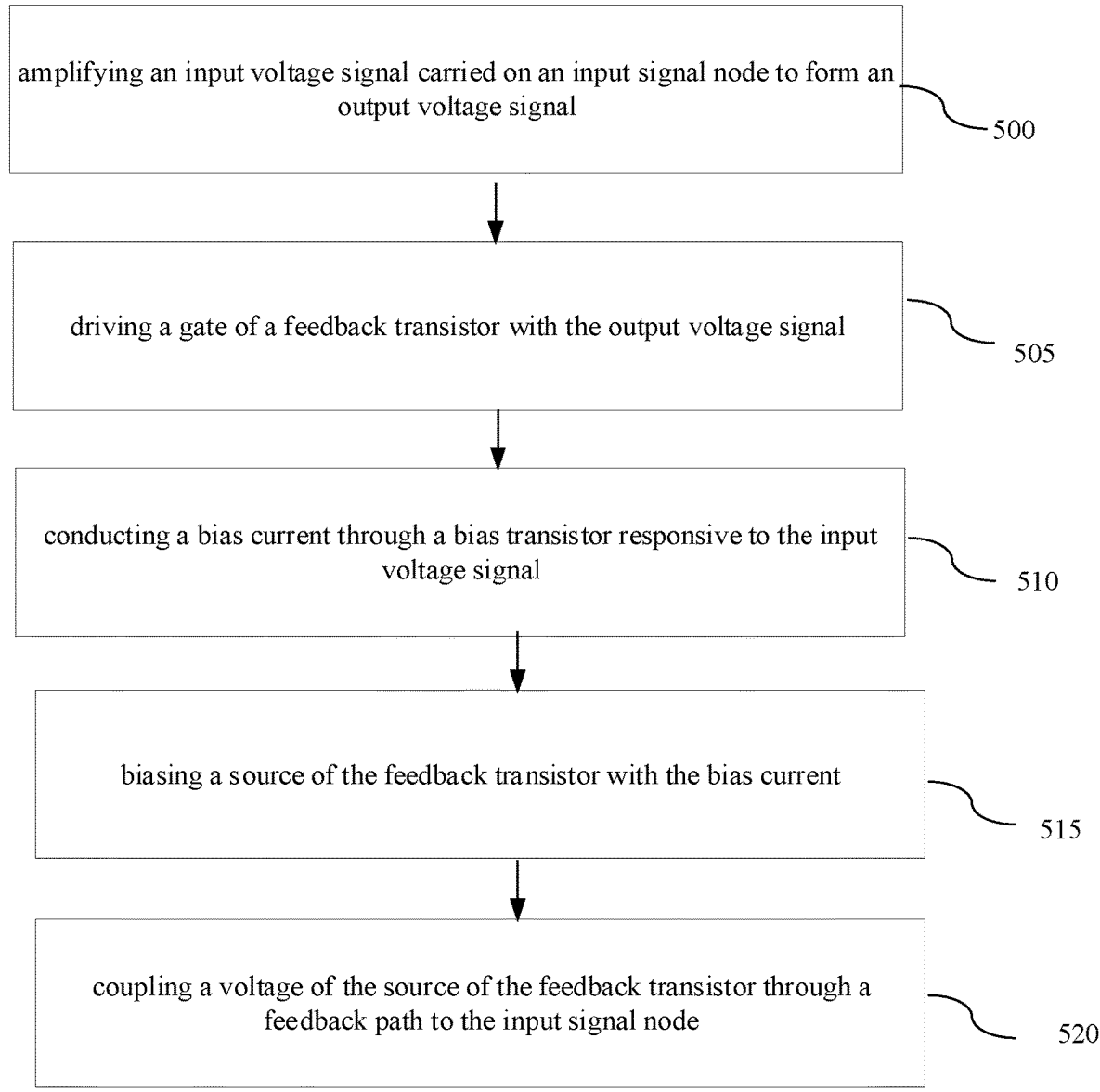
FIG. 5 is a method of adjusting the source bias of a feedback transistor in a low-noise amplifier responsive to the input voltage signal in accordance with an aspect of the disclosure.

A method of low-noise amplification will now be discussed with regard to the flowchart of FIG. 5. The method includes an act 500 of amplifying an input voltage signal carried on an input signal node to form an output voltage signal. The amplification through drive stage 105 in LNAs 100 and 300 is an example of act 500. Similarly, the amplification through high-gain drive stage 200 or through low-gain drive stage 205 is an example of act 500. The method further includes an act 505 of driving a gate of a feedback transistor with the output voltage signal. The driving of the gate of the feedback transistor M3 discussed herein is an example of act 505. In addition, the method also includes an act 510 of conducting a bias current through a bias transistor responsive to the input voltage signal. The driving of the gate of the bias transistors M4 or M4' to cause the bias transistor to conduct the bias current is an example of act 510. Moreover, the method includes an act 515 of biasing a source of the feedback transistor with the bias current. The biasing of the source of the feedback transistor M3 as disclosed herein is an example of act 515. Finally, the method includes an act 520 of coupling a voltage of the source of the feedback transistor through a feedback path to the input signal node. The operation of the feedback paths in LNAs 100 and 300 is an example of act 520.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A low-noise amplifier, comprising:
an input signal node;
a drive stage configured to amplify an input voltage signal on the input signal node into an output voltage signal on an output node;
a feedback transistor having a gate coupled to the output node;
a bias transistor having a drain coupled to a source of the feedback transistor and having a gate coupled to the input signal node; and
a feedback path coupled between the source of the feedback transistor and the input signal node.

2. The low-noise amplifier of claim 1, wherein the feedback path includes a feedback capacitor in series with a feedback resistor.

3. The low-noise amplifier of claim 2, wherein the drive stage comprises:

an NMOS drive transistor having a source coupled to ground, a drain coupled to the output node, and a gate coupled to the input signal node; and
a PMOS drive transistor having a source coupled to a power supply node for a power supply, a drain coupled to the output node, and a gate coupled to the input signal node.

4. The low-noise amplifier of claim 3, wherein the feedback transistor is an NMOS feedback transistor having a drain coupled to a power supply node for a power supply voltage.

5. The low-noise amplifier of claim 4, wherein the bias transistor is an NMOS bias transistor having a source coupled to ground.

6. The low-noise amplifier of claim 4, further comprising:
an NMOS cascode transistor, the drain of the NMOS drive transistor being coupled through the NMOS cascode transistor to the output node; and
a PMOS cascode transistor, the drain of the PMOS drive transistor being coupled through the PMOS cascode transistor to the output node.

7. The low-noise amplifier of claim 6, further comprising:
a first input capacitor coupled between the input signal node and the gate of the PMOS drive transistor; and
a second input capacitor coupled between the input signal node and the gate of the NMOS drive transistor.

8. The low-noise amplifier of claim 1, wherein the low-noise amplifier is integrated within a receiver comprising:
a mixer coupled to the output node of the low-noise amplifier; and
an analog-to-digital converter coupled to an output node of the mixer.

9. The low-noise amplifier of claim 8, wherein the receiver is integrated within a cellular telephone.

10. The low-noise amplifier of claim 2, wherein the feedback resistor is a tunable feedback resistor.

11. The low-noise amplifier of claim 3, wherein the feedback transistor is an PMOS feedback transistor having a drain coupled to ground.

12. The low-noise amplifier of claim 11, wherein the bias transistor is a PMOS bias transistor having a source coupled to the power supply node.

13. The low-noise amplifier of claim 12, further comprising:
an NMOS cascode transistor, the drain of the NMOS drive transistor being coupled through the NMOS cascode transistor to the output node; and
a PMOS cascode transistor, the drain of the PMOS drive transistor being coupled through the PMOS cascode transistor to the output node.

14. The low-noise amplifier of claim 1, wherein the drive stage is a high-gain drive stage, the low-noise amplifier further comprising:
a low-gain drive stage configured to amplify the input voltage signal according to a low gain during a low-gain mode to form the output voltage signal, wherein the low gain is less than a high gain for the high-gain drive stage.

15. A method for a low-noise amplifier, comprising:
amplifying an input voltage signal carried on an input signal node to form an output voltage signal;
driving a gate of a feedback transistor with the output voltage signal;
conducting a bias current through a bias transistor responsive to the input voltage signal;
biasing a source of the feedback transistor with the bias current; and coupling a source voltage of the source of the feedback transistor through a feedback path to the input signal node.

16. The method of claim 15, further comprising:
adjusting an impedance of the feedback path to adjust an input impedance of low-noise amplifier.

17. The method of claim 15, wherein adjusting the impedance of the feedback path comprise tuning a tunable resistor in the feedback path.

18. The method of claim 15, wherein the amplifying the input voltage signal comprises amplifying the input voltage signal in a drive stage including a drive transistor; and wherein the conducting the bias current through the bias transistor responsive to the input voltage signal comprises coupling a gate of the bias transistor to a gate of the drive transistor to cause the bias transistor to conduct the bias current.

19. The method of claim 15, further comprising:
mixing the output voltage signal with a local oscillator signal in a cellular telephone receiver to form an analog baseband signal; and
converting the analog baseband signal into a digital baseband signal.

20. A low-noise amplifier, comprising:
a high-gain drive stage;
a low-gain drive stage;
a feedback transistor;
a first bias transistor having a gate connected to an input signal node for the high-gain drive stage;
a first switch transistor configured to switch on during a high-gain mode of operation for the low-noise amplifier to couple a source of the feedback transistor to ground through the first bias transistor and to switch off during a low-gain mode of operation for the low-noise amplifier;
a second bias transistor having a gate connected to an input signal node for the low-gain drive stage; and
a second switch transistor configured to switch on during the low-gain mode of operation for the low-noise amplifier to couple the source of the feedback transistor to ground through the second bias transistor and to switch off during the high-gain mode of operation for the low-noise amplifier.

21. The low-noise amplifier of claim 20, wherein the low-gain drive stage includes an attenuator coupled between an input signal node of the low-noise amplifier and an input signal node of the low-gain drive stage.

22. The low-noise amplifier of claim 21, further comprising:
a feedback capacitor having a first terminal coupled to the source of the feedback transistor;
a first feedback resistor coupled between a second terminal of the feedback capacitor and the input signal node of the low-noise amplifier; and
a second feedback resistor coupled between the second terminal of the feedback capacitor and the input signal node of the low-gain stage.

23. The low-noise amplifier of claim 22, wherein the feedback transistor, the first bias transistor, and the second bias transistor each comprises an NMOS transistor.

24. The low-noise amplifier of claim 23, wherein the first switch transistor and the second switch transistor each comprises an NMOS transistor.

25. The low-noise amplifier of claim 20, wherein the low-noise amplifier is integrated into a radio frequency frontend circuit.

* * * * *